(12) United States Patent
Vizcara et al.

(10) Patent No.: US 6,628,129 B2
(45) Date of Patent: Sep. 30, 2003

(54) CLAMPING AND UNCLAMPING APPARATUS FOR A SEMICONDUCTOR TEST BOARD

(75) Inventors: Monica B. Vizcara, Baguio (PH); Bunny L. Gaab, Baguio (PH)

(73) Assignee: Texas Instruments Incorporated, Dallas, TX (US)

( * ) Notice: Subject to any disclaimer, the term of this patent is extended or adjusted under 35 U.S.C. 154(b) by 15 days.

(21) Appl. No.: 09/782,094

(22) Filed: Feb. 12, 2001

(65) Prior Publication Data

US 2002/0109516 A1 Aug. 15, 2002

(51) Int. Cl.[7] .............................................. G01R 31/02
(52) U.S. Cl. ........................ 324/755; 324/761; 324/760
(58) Field of Search ................................ 324/755, 761, 324/758, 760; 439/70, 72

Primary Examiner—Kamand Cuneo
Assistant Examiner—Tung X. Nguyen
(74) Attorney, Agent, or Firm—Michael K. Skrehot; Wade James Brady III; Frederick J. Telecky, Jr.

(57) ABSTRACT

A system for simultaneously securing a plurality of integrated circuits in a test fixture, comprising a base supporting a test board having a plurality of sockets. Each socket is configured to receive a integrated circuit and has a locked position and an unlocked position. The system further comprises a fixture adjacent to the test board and plurality of sockets comprising a support mechanism connected to the base, a contact region coupled to the support mechanism, and a means for moving the contact region to a contact position whereby the contact region, when in the contact position, contacts the plurality of sockets to move the plurality of sockets to the unlocked position.

20 Claims, 5 Drawing Sheets

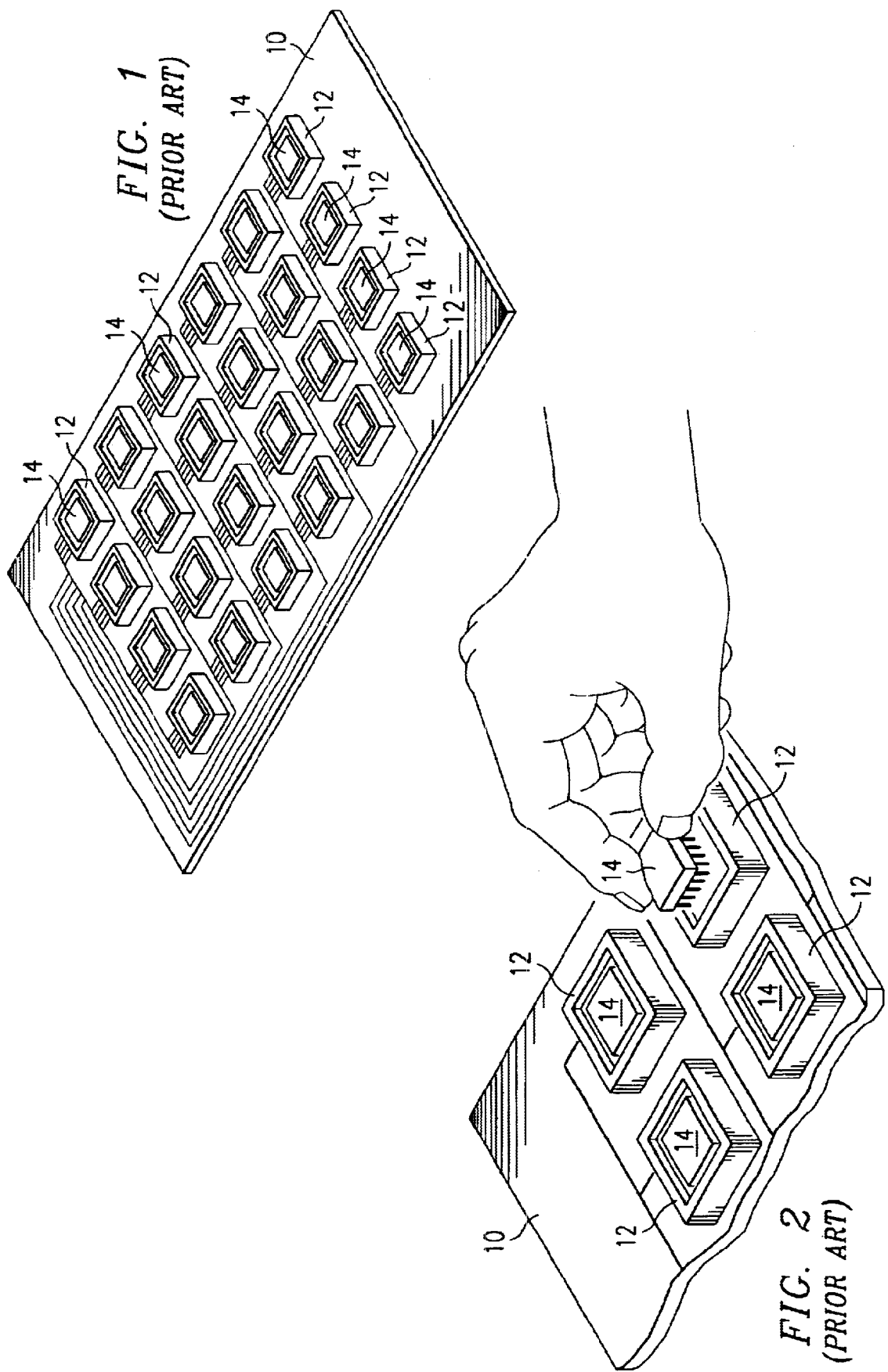

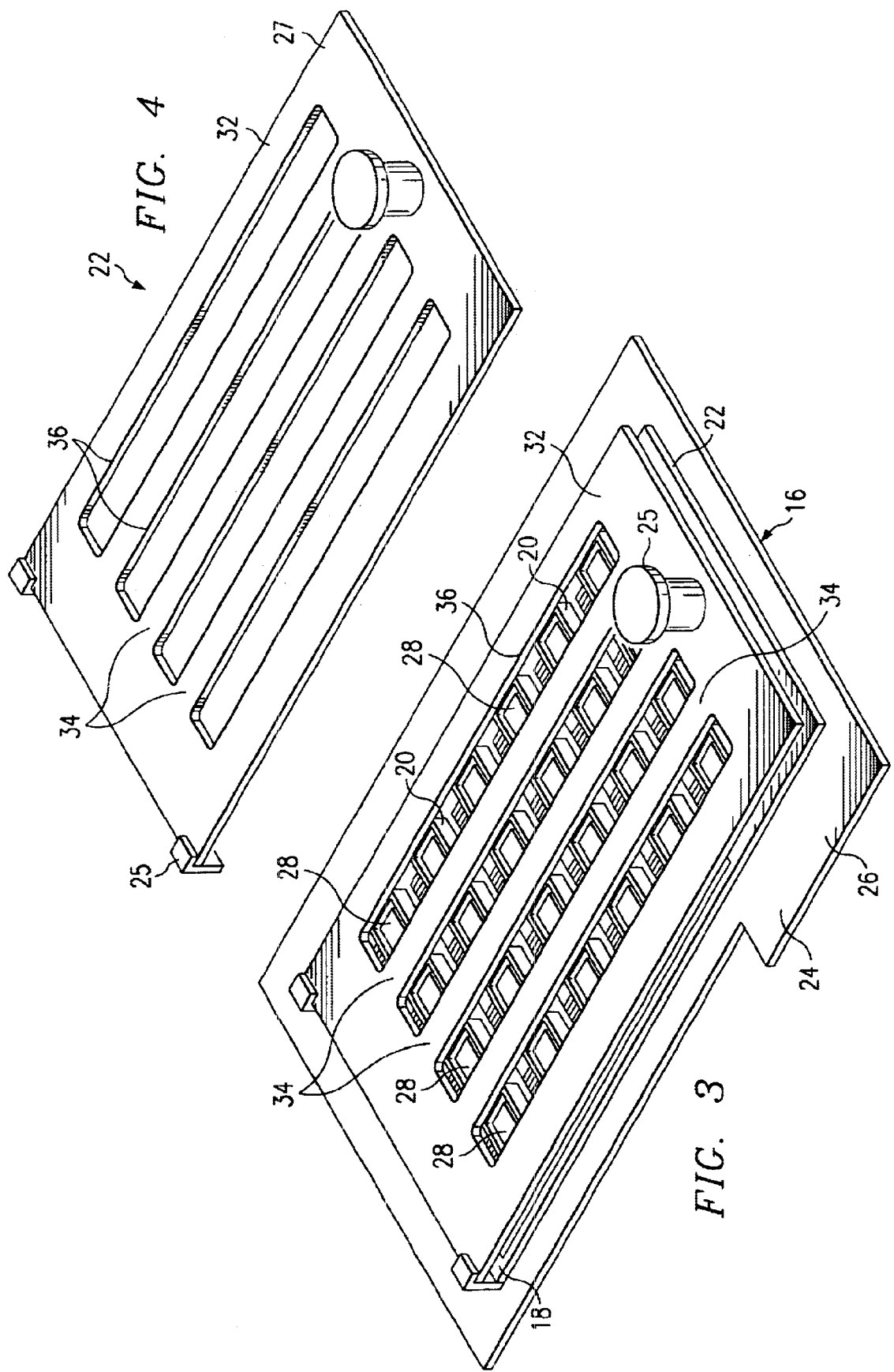

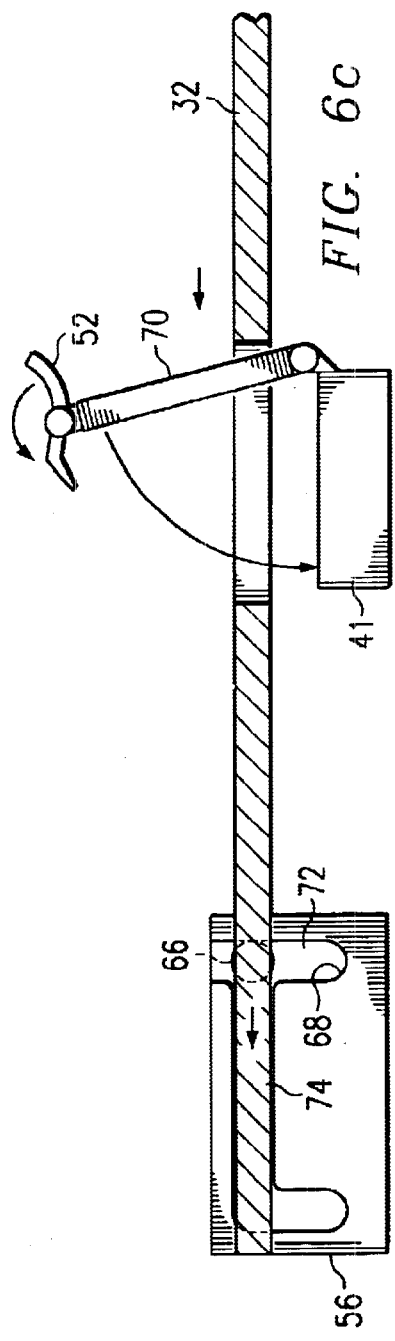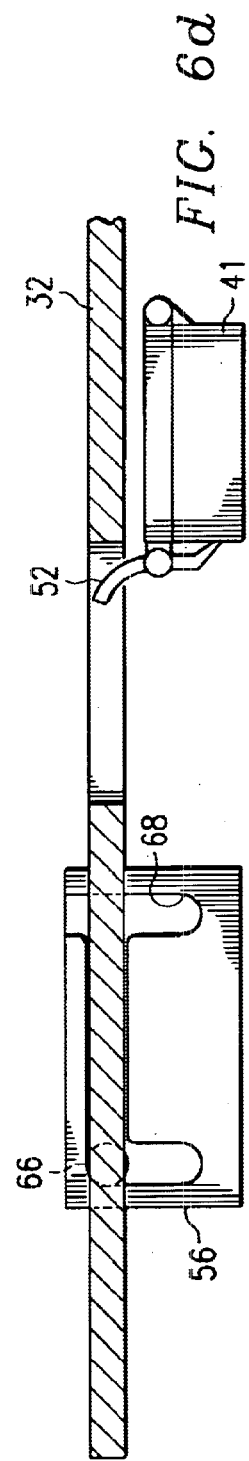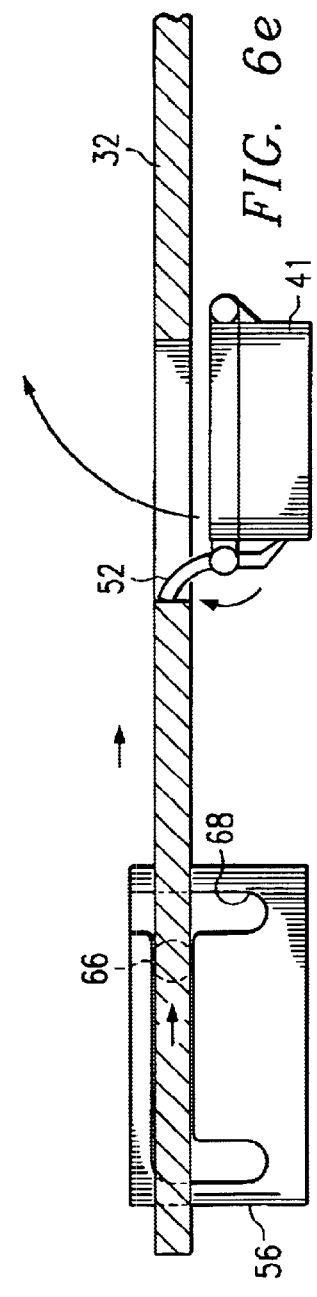

CLAMPING AND UNCLAMPING APPARATUS FOR A SEMICONDUCTOR TEST BOARD

TECHNICAL FIELD OF THE INVENTION

This invention relates to fixtures for securing integrated circuits to a test board and more particularly to an apparatus which simultaneously secures and releases multiple integrated circuits on a test board.

BACKGROUND OF THE INVENTION

Testing procedures for integrated circuits during the manufacturing process can be both costly and tedious. Many testing procedures are not automated, thus requiring human intervention. When human intervention is required, the design of testing equipment must take into consideration time efficiency, process flow, and human engineering factors.

Integrated circuits are generally tested using a test board designed to receive the integrated circuits and provide connection to test equipment. Many test boards contain spring loaded sockets which directly receive the integrated circuit and bring the pins of the integrated circuit into contact with test equipment which will exercise the circuit in some manner. Loading and securing the sockets is tedious and is generally performed by human workers who are subject to fatigue and error. The fatigue inherent to the process along with the time taken to individually secure the integrated circuits decrease productivity. Also, damage to the pins of the integrated circuit may result from excessive force in loading and securing the integrated circuits in the sockets. What is needed then is an easy, cost effective fixture to secure integrated circuits into test sockets that eliminates or minimizes worker fatigue and damage to the integrated circuits, thus resulting in increased productivity and yield.

SUMMARY OF THE INVENTION

These problems are generally solved, and technical advantages are generally achieved, by preferred embodiments of the present invention. A preferred embodiment of the present invention comprises a base, a test board supported by the base, a fixture adjacent to the test board and a plurality of sockets. A plurality of sockets each configured to receive an integrated circuit and having a locked position and an unlocked position are included on the test board. The fixture includes a support mechanism connected to the base, a contact region coupled to the support mechanism, and means for moving the contact region to a contact position. The contact region, when in the contact position, contacts the plurality of sockets to move the plurality of sockets to the unlocked position.

A method for testing a plurality of integrated circuits utilizing the preferred embodiment of the present invention described above comprises positioning the test board adjacent to the securing fixture, moving the contact region from the starting position to the contact position to simultaneously move the plurality of sockets into the unlocked position, and placing the plurality of integrated circuits into the plurality of sockets of the testing device. Once the plurality of integrated circuits are placed into the plurality of sockets, the contact region is moved to the starting position, the test board positioned for testing, and the test performed on the plurality of integrated circuits. After testing is completed the test board is positioned adjacent to the securing fixture again, the contact region is moved from the starting position to the contact position to simultaneously move the plurality of sockets into the unlocked position, and the plurality of integrated circuits removed from the plurality of test sockets.

An advantage of an embodiment of the present invention is that it increases productivity by allowing the integrated circuits to be simultaneously secured as opposed to individually securing each integrated circuit.

Another advantage of an embodiment of the present invention is that is reduces the fatigue on the workers loading the integrated circuits.

A further advantage of an embodiment of the present invention is that it can be designed to provide the appropriate securing force without damaging the integrated circuits.

BRIEF DESCRIPTION OF THE DRAWINGS

FIG. 1 illustrates the prior art test board having a plurality of sockets;

FIG. 2 illustrates the prior art method of loading and securing the integrated circuits in the plurality of sockets;

FIG. 3 illustrates a preferred embodiment test board, base, and fixture of the present invention in perspective view;

FIG. 4 illustrates a preferred embodiment fixture;

FIGS. 6a–6e illustrate a preferred embodiment of the present invention for securing and releasing claim shell devices.

DETAILED DESCRIPTION OF THE PRESENT INVENTION

Figure 5:
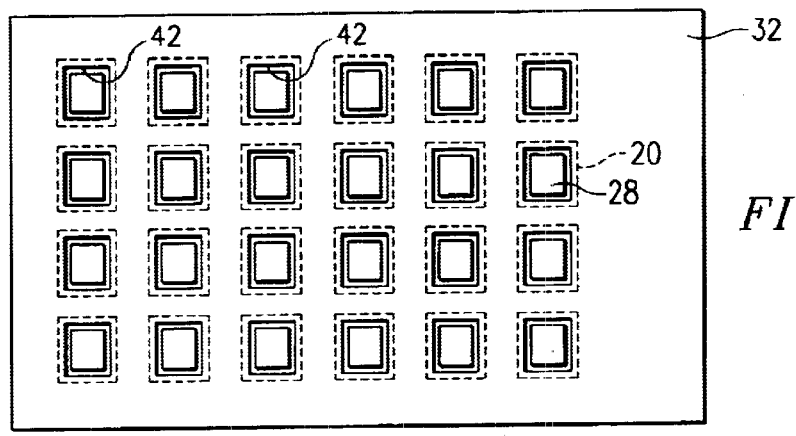
FIG. 5 illustrates another preferred embodiment fixture of the present invention in plan view.

FIG. 1 illustrates a test board 10 having a plurality of sockets 12. The plurality of sockets 12 are designed to hold packaged integrated circuits 14 for testing. The sockets 12 may be any socket which are suitable for receiving a packaged integrated circuit. However, illustrative embodiments for use with Ball Grid Array (BGA) and Quad Flat Pack (QFP) will be discussed. The sockets 12 comprise a spring mechanism and a locking mechanism (not shown). When the socket 12 is pressed, the spring is compressed and disengages the locking mechanism. When the locking mechanism is disengaged, a packaged integrated circuit 14 may be inserted or removed from the socket 12. When the socket 12 is not pressed, the spring expands and the locking mechanism is engaged. The packaged integrated circuit 14, if seated in the socket when the locking mechanism is engaged, is secured in the socket 12.

FIG. 2 illustrates the prior art method of loading a packaged integrated circuit 14 into a socket 12. The method is not automated thus requiring manual loading of the socket 12. For each insertion of a packaged integrated circuit 14 into the socket 12, a worker must manually press the socket to disengage the locking mechanism. The packaged integrated circuit is then seated in the socket 12 by the worker and the socket 12 released. This is done until each socket 12 on test board 10 is loaded with an integrated circuit 14. A test board may contain any number of sockets. Once testing is completed on the loaded packaged integrated circuits 14, each socket 12 must be pressed to unload each packaged integrated circuit 14. This routine must be completed by the worker for test boards throughout the day resulting in fatigue of the worker and thus, less productivity.

A preferred embodiment of the present invention, as illustrated in FIG. 3, provides a system that can be used to engage the sockets 20 for simultaneous loading of the sockets 20. This embodiment is preferably used with BGA devices although the teachings herein apply to other package types such as Quad Flat Packages (QFP), pin grid array, surface mount packages, and the like. The system comprises a base 16, a test board 18 having a plurality of sockets 20, and a fixture 22 (shown in FIG. 4) for exerting a predetermined force on the sockets 20. The base 16 and fixture 22 can be made of any suitable material but preferably comprises a metallic material e.g., aluminum and stainless steel. In the preferred embodiment, the base 16 is a plate 24 having a flat surface 26 upon which the test board 18 is supported. The plate 24 may include guides (not shown) which can be utilized to ensure correct positioning of the test board onto the plate 24. Each socket 20 is configured to receive a packaged integrated circuit 28. The sockets 20 each have a locked position and an unlocked position. In the unlocked position the packaged integrated circuit 28 may be loaded or unloaded. The unlocked position is obtained by pressing down on the sockets 20. While the locked and unlocked positions are described as being obtained by pressing down on the sockets 20, thus inferring motion along a vertical axis, it should be appreciated by one skilled in the art that the locked and unlocked positions may be obtained by other movements e.g., along a horizontal axis (side-to-side).

The fixture 22, as shown in FIG. 4, comprises a support mechanism 25 connected to the base 16, a contact region 27 coupled to the support mechanism 25, and a means for moving the contact region 27 into contact with the sockets 20 to unlock the sockets 20 for loading or unloading. The contact region 27 in the preferred embodiment is a top plate 32 having a plurality of extending members 34 which are formed by orifices 36 in the top plate 32.

Referring back to FIG. 3, the extending members 34 extend the length of the test board and are designed to contact the sockets 20 to move the sockets 20 to the unlocked position. The orifices 36 provide an opening such that the pressure exerted on the top plate 32 does not extend to the packaged integrated circuits 28 themselves but only to two opposing edges 38, 40 of the sockets 20. This protects the packaged integrated circuits 28 from being damaged by the force exerted to unlock the sockets 20. Orifices 36 also allow the integrated circuits 28 to be loaded/unloaded when the plate 32 is in place to have the pressure exerted. It should be appreciated that the configuration of the plate 32 as described above does not limit the present invention. For example, the top plate 32 may comprise a series of orifices 42 of substantially the same shape and size as the sockets 20 wherein pressure is exerted on all the edges of the sockets 20 but not the integrated circuits 28 themselves(shown in FIG. 5).

The means for moving the contact region 27 into contact with the integrated circuits 28 may be, but is not limited to a pneumatic lever. It should be appreciated that other types of levers may be utilized such as a mechanical lever, a spring mechanism, a clamping device and the like.

Figures 6A, 6B:
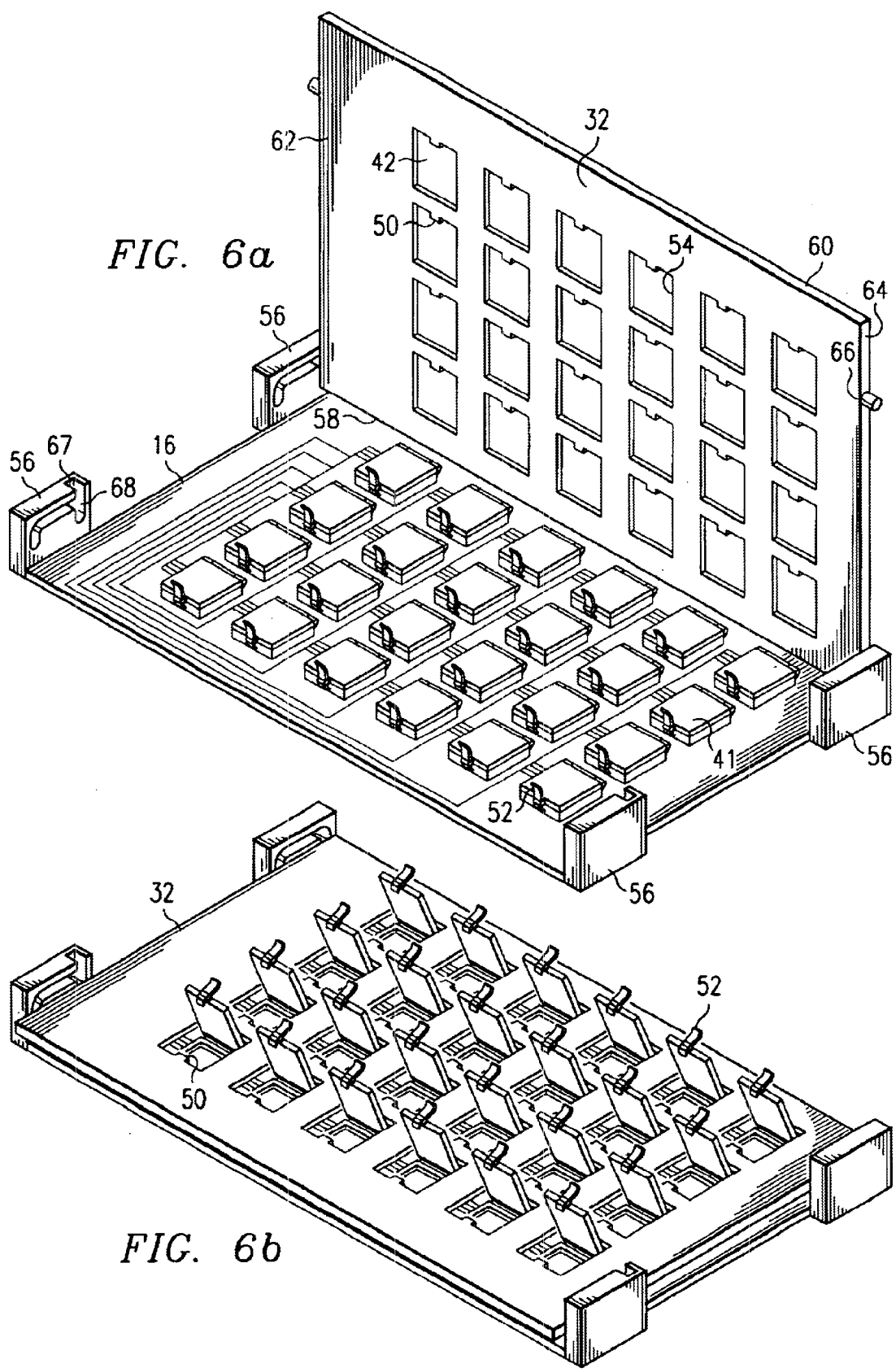

FIG. 6a illustrates another embodiment of the present invention which may be used with packaged integrated circuits which require testing in sockets 41 which are clam shell devices. This embodiment is typically used to test QFP devices but is applicable to other packages as well. In this embodiment, the top plate 32 containing the series of orifices 42 comprises a lifting member 50. The lifting member 50 is utilized to apply a lifting force to a top member 52 of the socket 41. The lifting member 50 is integrally formed at an edge 54 of each orifice 42 within the top plate 32 as shown in FIG. 6b. The lifting member 50 can be comprised of any material which can apply the lifting force, but is preferably of the same material as the top plate 32.

Referring Back to FIG. 6a, the top plate 32 further comprises a top and bottom edge, 58 and 60, respectively, two side edges, 62 and 64, and four rollers 66 located at each of the two edges 62,64 of the top plate 32. The rollers 66 are designed to operate within a plurality of slotted members 56. The slotted members 56 that engage with the rollers 66 located near the top edge 58 of the top plate 32 act as a hinge to secure the top plate 32 to the base 16. Each slotted member 56 comprises a substantially unshaped cavity 68 in which the rollers 66 are designed to move. The slotted members 56 that engage with rollers 66 located near the bottom edge 60 of the top plate 32 are designed with an opening 67 whereby the rollers 66 can enter the u-shaped cavity 68. The cavity 68 allows the top plate 32 to be lifted and lowered as necessary to come into contact with the socket 41 as described below.

FIG. 6c, illustrates in detail view how the preferred embodiment fixture operates to close an exemplary socket 41. To close the socket 41, the top plate 32 is lifted up and pushed/pulled in the direction of lid 70 of the socket 41 as indicated by the arrows in FIG. 6c. As the top plate 32 is pushed\pulled in the direction of lid 70, the rollers 66 move along a second leg 74 of the cavity 68. The lid 70 of the socket 41 is pushed closed as shown in FIG. 6d. When the lid 70 is pushed closed, the lifting member is engaged with the socket 41 to lock the socket 41.

FIG. 6e illustrates the opening of the socket 41. To open the device, the top plate 32 is pulled/pushed in the opposite direction, which allows the lifting member 50 of the top plate 32 to come into contact with the top member 52 of the lid 70. This facilitates the release of the lid 70 and the movement of the socket 41 into an open position. The integrated circuit can then be seated in or removed from the socket 41.

Figure 7:
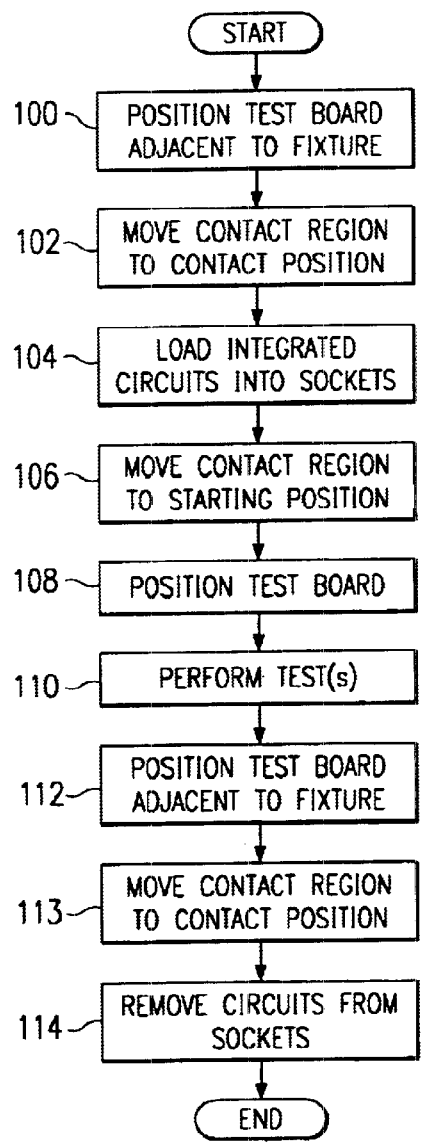
FIG. 7 is a flow chart of a preferred method of using the preferred embodiment of the present invention.

FIG. 7 is a flowchart describing a method by which the above described preferred embodiments of the present invention may be used in a testing cycle. At step 100, the test board is positioned adjacent to the securing fixture. The contact region is moved from a starting position to a contact position to simultaneously move the plurality of sockets into the unlocked position (step 102). The integrated circuits are placed into the plurality of sockets of the testing device at step 104. At step 106 the contact region is moved to the starting position and the test board positioned for testing at step 108. The testing is performed on the integrated circuits (step 110). Once the testing has ended, the test board is again positioned adjacent to the securing fixture to simultaneously move the sockets into the unlocked position (step 112). At step 114, the integrated circuits are removed from the plurality of test sockets.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A system for simultaneously securing and releasing a plurality of integrated circuits in a test fixture, comprising:
    a base;

a test board supported by the base, the test board having a plurality of sockets, each socket configured to receive a integrated circuit and having a locked position and an unlocked position;

a fixture adjacent to the test board and plurality of sockets comprising:
  a support mechanism connected to the base;
  a contact region coupled to the support mechanism; and
  means for moving the contact region to a contact position whereby the contact region, when in the contact position, contacts the plurality of sockets to move the plurality of sockets to the unlocked position.

2. The system of claim 1 wherein the contact region is comprised of a plurality of extending members which extend the length of the test board and are designed to contact the plurality of sockets to move the plurality of sockets to the unlocked position.

3. The system of claim 1 wherein the contact region is comprised of a plate having a plurality of orifices which are designed to substantially align with the plurality of integrated circuits when seated in the plurality of sockets.

4. The system of claim 3 wherein the plurality of sockets are clam shell devices.

5. The system of claim 4 wherein the clam shell devices each comprise a lid having a top member attached to the lid for locking and unlocking the clam shell devices.

6. The system of claim 4 wherein the plate comprises a plurality of lifting members attached to the plurality of openings, the lifting members designed to provide a lifting force to the clam shell device.

7. The system of claim 1 wherein the fixture is comprised of a metallic material.

8. The system of claim 7 wherein the metallic material is chosen from the group consisting of aluminum and stainless steel.

9. The system of claim 1 wherein the integrated circuit is a QFP package.

10. The system of claim 1 wherein the integrated circuit is a BGA package.

11. The system of claim 1 wherein the means for moving is a pneumatic lever.

12. A system for simultaneously securing or releasing a plurality of integrated circuits in a test fixture, comprising:
  a test board having a plurality of sockets, each socket configured to receive a integrated circuit and having a locked position and an unlocked position;
  a fixture adjacent to the test board and plurality of sockets comprising:
    a contact region; and
    means for moving the contact region to a contact position whereby the contact region, when in the contact position, contacts the plurality of sockets to move the plurality of sockets to the unlocked position.

13. The system of claim 12 wherein the contact region is a plurality of extending members which extend the length of the test board and are designed to contact the plurality of sockets to move the plurality of sockets to the unlocked position.

14. The system of claim 12 wherein the contact region is a plate having a plurality of orifices which are designed to substantially align with the plurality of integrated circuits when seated in the plurality of sockets.

15. The system of claim 14 wherein the plurality of sockets are clam shell devices.

16. The system of claim 15 wherein the plate comprises a plurality of lifting members attached to the plurality of openings, the lifting members designed to provide a lifting force to the clam shell device.

17. The system of claim 12 wherein the fixture is comprised of a metallic material.

18. The system of claim 17 wherein the metallic material is chosen from the group consisting of aluminum and stainless steel.

19. The system of claim 12 wherein the integrated circuit is a QFP package.

20. The system of claim 12 wherein the integrated circuit is a BGA package.

* * * * *